(12) United States Patent
Azuma et al.

(10) Patent No.: US 7,998,841 B2
(45) Date of Patent: Aug. 16, 2011

(54) METHOD FOR DEHYDROGENATION TREATMENT AND METHOD FOR FORMING CRYSTALLINE SILICON FILM

(75) Inventors: Kazufumi Azuma, Yokohama (JP); Hajime Shirai, Saitama (JP)

(73) Assignee: Advanced LCD Technologies Development Center Co., Ltd., Kawasaki-shi (JP)

( * ) Notice: Subject to any disclaimer, the term of this patent is extended or adjusted under 35 U.S.C. 154(b) by 121 days.

(21) Appl. No.: 12/397,717

(22) Filed: Mar. 4, 2009

(65) Prior Publication Data
US 2009/0246939 A1 Oct. 1, 2009

(30) Foreign Application Priority Data
Mar. 25, 2008 (JP) .................. 2008-079019

(51) Int. Cl.
*H01L 21/36* (2006.01)
(52) U.S. Cl. ........ 438/474; 438/482; 438/486; 438/487; 257/E21.134
(58) Field of Classification Search .................. 438/482, 438/486, 487, 474; 257/E21.134
See application file for complete search history.

(56) References Cited

U.S. PATENT DOCUMENTS

| 4,853,250 A | * | 8/1989 | Boulos et al. ................. 427/446 |
| 5,680,014 A | * | 10/1997 | Miyamoto et al. ........ 315/111.41 |
| 2002/0056875 A1 | * | 5/2002 | Hayashi ........................ 257/349 |
| 2005/0191796 A1 | * | 9/2005 | Takahashi ..................... 438/151 |
| 2006/0108688 A1 | * | 5/2006 | Richardson et al. .......... 257/756 |
| 2007/0037366 A1 | * | 2/2007 | Nakamura ..................... 438/487 |

FOREIGN PATENT DOCUMENTS

| JP | 2004-335927 | 11/2004 |
| JP | 2005-26354 | 1/2005 |
| JP | 2005-325434 | 11/2005 |
| JP | 2006-60130 | 3/2006 |
| JP | 2007-73941 | 3/2007 |

* cited by examiner

*Primary Examiner* — Michael Trinh
(74) *Attorney, Agent, or Firm* — Oblon, Spivak, McClelland, Maier & Neustadt, L.L.P.

(57) ABSTRACT

A dehydrogenation treatment method which includes forming a hydrogenated amorphous silicon film above a non-heat-resistant substrate, and eliminating bonded hydrogen from the hydrogenated amorphous silicon film by irradiating an atmospheric thermal plasma discharge to the hydrogenated amorphous silicon film for a time period of 1 to 500 ms. The surface of the substrate is heated at a temperature of 1000 to 2000° C. by irradiating the atmospheric thermal plasma discharge.

17 Claims, 6 Drawing Sheets

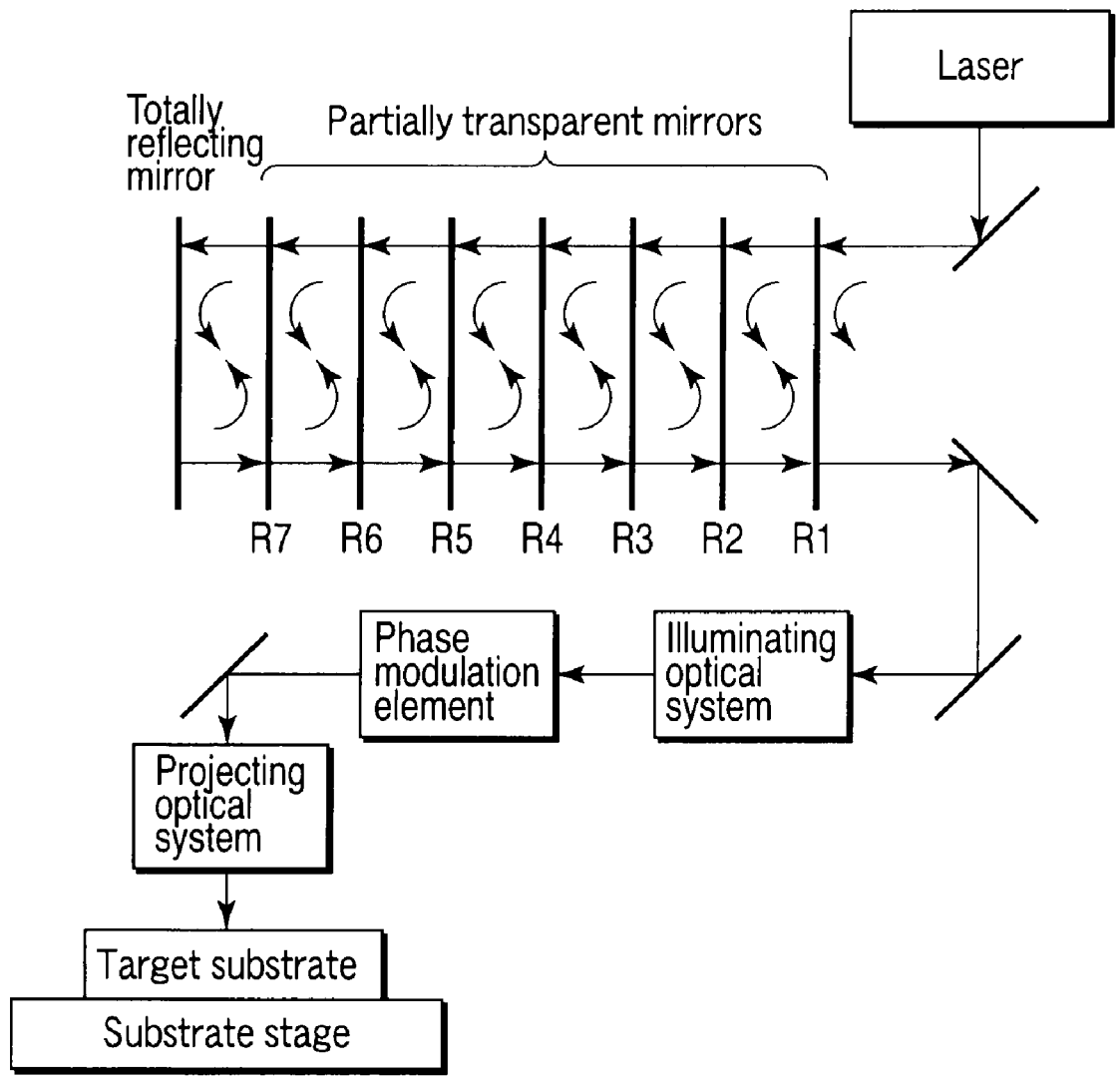
F I G. 6

METHOD FOR DEHYDROGENATION TREATMENT AND METHOD FOR FORMING CRYSTALLINE SILICON FILM

CROSS-REFERENCE TO RELATED APPLICATIONS

This application is based upon and claims the benefit of priority from prior Japanese Patent Application No. 2008-079019, filed Mar. 25, 2008, the entire contents of which are incorporated herein by reference.

BACKGROUND OF THE INVENTION

1. Field of the Invention

This invention relates to a method for the dehydrogenation treatment of a hydrogenated amorphous silicon film and to a method for forming a crystalline silicon film.

2. Description of the Related Art

Conventionally, the driving circuit of a display device such as a liquid crystal display device is formed of an amorphous semiconductor film formed on a glass substrate. Due to the increasing expansion of IT market, the information to be handled is now digitalized and accelerated in processing speed, so that the display device is also required to display high-quality pictures. In order to meet such a requirement, there has been developed a driving circuit wherein a switching transistor for switching each of pixels, for example, is formed on a crystalline semiconductor film region such as a crystalline silicon film, thereby making it possible to realize the acceleration of processing speed and to enhance the quality of pictures.

The crystalline silicon film can be obtained through the crystallization of amorphous silicon film that has been formed on a glass substrate. As the method of crystallizing the amorphous silicon film, a method of melting the amorphous silicon film by the irradiation of microplasma jet is proposed in JP 2006-60130 (KOKAI).

In JP 2007-73941 (KOKAI), the employment of excimer laser annealing (ELA) method is proposed as a method of crystallizing the amorphous silicon film. In this case, by taking into consideration the resistance of amorphous silicon film to laser, a hydrogenated amorphous silicon film that has been undergone dehydrogenation treatment is employed as the amorphous silicon film. This hydrogenated amorphous silicon film is generally formed by a plasma enhanced chemical vapor deposition (PECVD) method.

For example, an amorphous silicon film which has been formed by the PECVD method using silane gas as a raw material contains about 10% to 15% of bonded hydrogen. Such an amorphous silicon film has sufficient density and can be formed practical speed. However, the bonded hydrogen may become a cause for the ablation of film on the occasion of performing laser crystallization. In order to eliminate bonded hydrogen from the film, there has been conventionally employed a process wherein the hydrogenated amorphous silicon film that has been formed by the PECVD method is heated for several hours at a temperature of 500° C. or more in an electric furnace.

By performing this heat treatment, the content of hydrogen in the film is reduced to 1% or less, thereby making it possible to achieve the laser crystallization without generating the ablation. However, when a glass substrate which is low in heat resistance is employed, the heat treatment at high temperatures would become a cause for generating deformation and moreover the heat treatment for several hours may lead to the deterioration of throughput.

In order to obtain a crystallized silicon film of high qualities from a hydrogen-containing amorphous silicon film which has been formed on a non-heat-resistant substrate such as a glass substrate, it is required to perform the heat treatment without deforming and degrading such a substrate. However, no one has succeeded in discovering an appropriate method for overcoming this problem to date.

BRIEF SUMMARY OF THE INVENTION

The present invention has been made in view of the aforementioned circumstances and therefore an object of the present invention is to provide a dehydrogenation treatment method for forming an amorphous silicon film which is excellent in laser resistance without giving any adverse influence to a non-heat-resistant substrate. Another object of the present invention is to provide a method for crystallizing the amorphous silicon film obtained in this manner.

A first aspect of the present invention is to provide a dehydrogenation treatment method which comprises forming a hydrogenated amorphous silicon film above a non-heat-resistant substrate; and eliminating bonded hydrogen from the hydrogenated amorphous silicon film by irradiating an atmospheric thermal plasma discharge to the hydrogenated amorphous silicon film for a time period of 1 to 500 ms to heat a surface of the substrate at a temperature of 1000 to 2000° C.

A second aspect of the present invention is to provide a method for forming a crystalline silicon film which comprises forming an amorphous silicon film above a non-heat-resistant substrate; and irradiating laser beam to the amorphous silicon film to crystallize the amorphous silicon film; wherein forming the amorphous silicon film is performed by applying a dehydrogenation treatment to the hydrogenated amorphous silicon film using the above-described method.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 6 is a structural block diagram illustrating the crystallization apparatus;

DETAILED DESCRIPTION OF THE INVENTION

When a high temperature heat source is irradiated onto a hydrogenated amorphous silicon film formed on a non-heat-resistant substrate in order to perform the dehydrogenation treatment thereof, the surface temperature of the non-heat-resistant substrate is caused to rise. In the interior of the non-heat-resistant substrate, the temperature thereof rises slower than the surface of the non-heat-resistant substrate, so that when the temperature becomes higher than a certain predetermined temperature, the substrate deforms. The present inventors have found out optimum conditions for dissociating hydrogen from a hydrogenated amorphous silicon film without bringing about the deformation and degradation of a non-heat-resistant substrate such as a glass substrate. The present invention has been accomplished based on this finding.

Next, embodiments of the present invention will be explained with reference to drawings.

Figure 1:
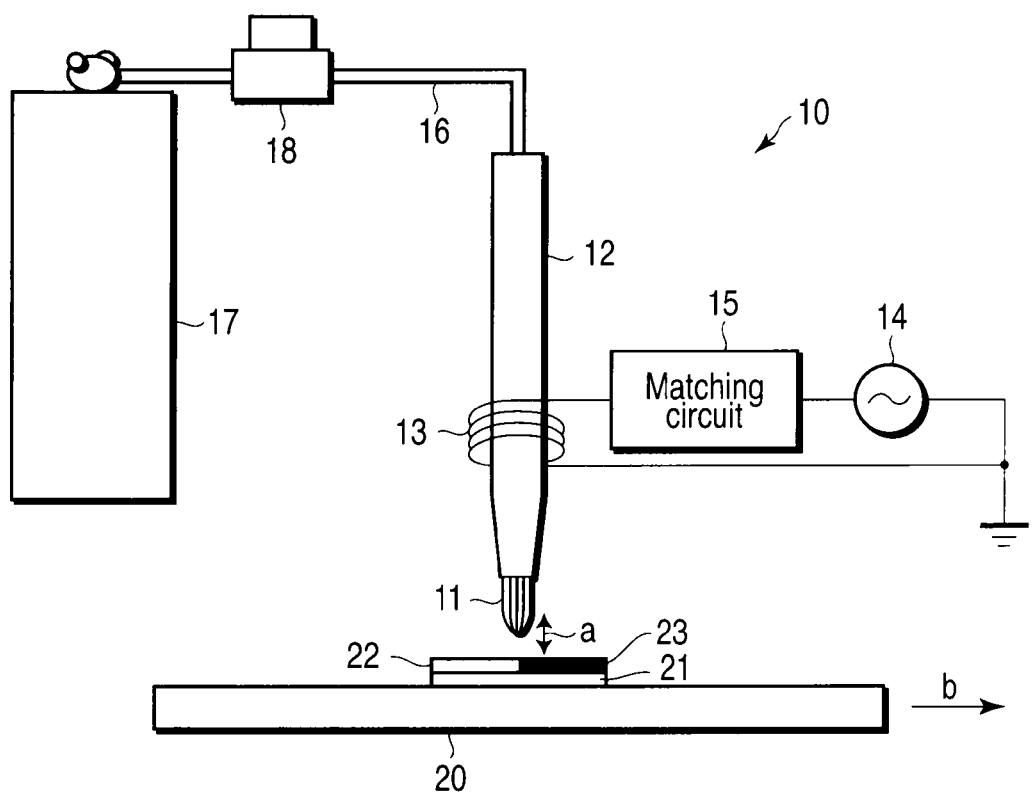
FIG. 1 is a schematic diagram illustrating the high-frequency plasma discharge to be employed in the method according to one embodiment of the present invention.

FIG. 1 is a schematic diagram illustrating an apparatus which makes it possible to employ the dehydrogenation treatment method according to one embodiment of the present invention. This apparatus is constituted by a quartz tube 12 for generating a plasma discharge 11, a high-frequency inductive coil 13 for generating a high-frequency magnetic field in the quartz tube 12, a high-frequency power source 14 for feeding an electromagnetic wave to the high-frequency inductive coil 13, a matching circuit 15 for creating alignment between the high-frequency power source 14 and the high-frequency inductive coil 13, a gas supply source 17 for feeding a plasma gas such as argon, helium, oxygen, nitrogen, etc., to the quartz tube 12 through a gas inlet tube 16, and a flow rate adjustor 18 for controlling the flow rate of a plasma-generating gas.

Furthermore, this apparatus is also equipped with a shifting means (not shown) for changing the relative position (the arrow "a" direction and the arrow "b" direction) between a stage 20 on which a non-heat-resistant substrate 21 having a hydrogenated amorphous silicon film 22 formed thereon is mounted and the plasma discharge 11.

The quartz tube 12 is formed of a duplex tube having a total length of 100-150 mm. The diameter of the inner tube is 2 mm and the diameter of the outer tube is 20 mm. The bore diameter of an injection port for injecting the plasma discharge 11 is set to 20 mm. The inside of the inner tube is a discharging region and the space between the inner tube and the outer tube is assigned as a region for passing a sheath gas. The high-frequency power source 14 is enabled to output a high-frequency power (1600 W) of 10-27 MHz. The matching circuit 15 is adjusted in such a manner that the reflected wave returning to the high-frequency power source 14 from the high-frequency inductive coil 13 can be minimized.

When a high-frequency current that has been supplied from the high-frequency power source 14 is passed to the high-frequency inductive coil 13, this coil 13 generates an inductive electric field in the quartz tube 12. Because of this, argon (Ar) gas for example is employed as a plasma-generating gas, the argon atom of the argon gas that has been supplied from the gas supply source 17 and permitted to flow into the quartz tube 12 after being adjusted to a predetermined pressure by the flow rate adjustor 18 electrically dissociates at the inductive electric field and turn into plasma of high temperatures (10000° C. or more), which is then pushed by the inlet pressure of the argon gas and injected into air atmosphere from the injection port provided at the distal end of the quartz tube 12.

The plasma that has been injected is turned into the plasma discharge 11 having an electron density of about $10^{15}/cm^3$ without being diffused owing to the presence of atmospheric air. The energy of this plasma discharge 11 can be altered by controlling a flow rate adjustor 35 which adjusts the flow rate of the argon gas or by controlling the power supply of the high-frequency power source 14.

As the non-heat-resistant substrate 21, a glass substrate, etc., can be employed. By CVD (for example, a plasma chemical vapor phase growth method, a low-pressure chemical vapor phase growth method, etc.), a hydrogenated amorphous silicon film 22 having such a film thickness (around 100 nm, for example) that is suited for the application to TFT can be formed on this glass substrate.

The hydrogenated amorphous silicon film 22 may be deposited, via an underlying insulating film (not shown), on the glass substrate 21. The underlying insulating film can be formed using an insulating material such as $SiO_2$ for example. This underlying insulating film is useful in preventing foreign matters contained in the glass substrate such as Na from entering into the amorphous silicon film through the direct contact between the hydrogenated amorphous silicon film 22 and the glass substrate 21. Furthermore, this underlying insulating film is also useful in preventing the heat that has been generated on the occasion of fusing the hydrogenated amorphous silicon film from being directly transferred to the non-heat-resistant substrate.

The irradiation of the plasma discharge 11 to the hydrogenated amorphous silicon film 22 is performed by adjusting the relative distance between the substrate 21 and the quartz tube 12 so as to enable the distal end of the plasma discharge 11 to reach the hydrogenated amorphous silicon film 22.

When the hydrogenated amorphous silicon film 22 is positioned at the irradiation site, hydrogen can be dissociated from the hydrogenated amorphous silicon film 22 by a short period of irradiation, such as not more than several milliseconds, of the plasma discharge. The quantity of hydrogen to be dissociated from the film may depend on the surface temperature of the glass substrate 11, which rises due to the irradiation of the plasma discharge, and the surface temperature of the glass substrate 11 is determined in conformity with the irradiation time of the plasma discharge 11. It should be noted that the irradiation time of the plasma discharge 11 can be controlled by controlling the moving (scanning) velocity of the stage 20 in the direction of the arrow "b".

When the stage 20 is moved in the direction of the arrow "b", the dissociation of hydrogen occurs at a region of the hydrogenated amorphous silicon film which is located on a track being irradiated with the plasma discharge 11. The irradiation time (dwell time) can be defined by a value that can be obtained by dividing the irradiation width of the plasma discharge 11 by the moving velocity of the stage 20. When the movement of the stage 20 is performed two-dimensionally, the hydrogen can be dissociated from a predetermined region of the hydrogenated amorphous silicon film 22, thereby obtaining a dehydrogenated region.

Alternatively, a plurality of plasma discharges may be simultaneously irradiated onto the hydrogenated amorphous silicon film 22, thereby making it possible to perform concurrent dehydrogenation from the wide region of hydrogenated amorphous silicon film. When a plurality of plasma discharges are relatively scanned to the substrate, the dehydrogenation treatment of the entire surface of hydrogenated amorphous silicon film 22 may be accomplished within a short period of time.

With respect to the plasma discharge, there are known a direct current plasma discharge in addition to the high-frequency plasma discharge. With respect to this direct current plasma discharge, there are known two kinds of system, i.e. a transfer system and a non-transfer system. While a cathode is disposed in the vicinity of the nozzle in the case of the direct current plasma discharge, an inductive electrodeless discharge is employed in the case of the high-frequency plasma discharge. Although the high-frequency plasma discharge is more preferable in the respect that there is no possibility of the contamination that may be caused by metallic electrodes, the direct current plasma discharge may be also employed depending on the intended use, taking into consideration the omission of the matching box, etc.

Using the apparatus shown in FIG. 1, the dehydrogenation treatment of a hydrogenated amorphous silicon film was performed. By the CVD method, the hydrogenated amorphous silicon film 22 was deposited to a thickness of about 100 nm, for example, on the glass substrate 21. This glass substrate 21 was mounted on the stage 20 and the plasma discharge 11 was irradiated onto the hydrogenated amorphous silicon film 22 while shifting the stage 20. The generation of the plasma discharge 11 was performed by flowing argon gas into the inner tube of the quartz tube 12 and by outputting a high-frequency power of 13.56 MHz band from the high-frequency power source 14.

The dwell time (ms) was obtained by dividing the irradiation width of the plasma discharge 11 by the moving velocity of the stage 20. The maximum temperature of the surface of the glass substrate was measured using a thermocouple and the quantity of hydrogen contained in the film was determined by Rutherford forwardscattering method.

Further, from Raman spectrum, the state of the film after the treatment was observed. If there is no peak at 520 cm$^{-1}$ and any peak originating from the Si—H bond is not existed in the vicinity of 2000 cm$^{-1}$, the occurrence of dehydrogenation reaction while keeping the amorphous silicon as it is can be confirmed.

The results obtained are summarized in the following Table 1.

TABLE 1

| | Dwell time (ms) | | |
|---|---|---|---|
| | 0 | 10 | 20 |
| T$_{max}$ | Room temp. | 1375° C. | 1650° C. |
| Hydrogen content in film (%) | 11.5 | <1% | <1% |
| State of film | α-Si:H | Dehydrogenation | c-Si |

As shown in above Table 1, in the hydrogenated amorphous silicon film prior to the irradiation of the plasma discharge, the surface temperature of substrate was room temperature and the content of hydrogen in the film was 11.5%, for example. When the plasma discharge was irradiated, the surface temperature of substrate was caused to rise to 1000° C. or more within a short period of several milliseconds, thereby decreasing the quantity of hydrogen in the film. More specifically, the surface temperature of the substrate became 1375° C. by the irradiation of the plasma discharge for a period of 10 ms and the content of hydrogen in the film was less than 1%. It was confirmed from Raman spectrum that no peak was recognized at 520 cm$^{-1}$ and any peak originating from the Si—H bond was not existed in the vicinity of 2000 cm$^{-1}$, thereby indicating the occurrence of dehydrogenation reaction while keeping the amorphous silicon as it was.

When the irradiation time of the plasma discharge was further prolonged to 20 ms, the surface temperature of substrate was caused to rise to 1650° C. The content of hydrogen in the film was less than 1% and the film was turned into polycrystalline film. It was confirmed from the observation using SEM that the size of crystal grain created was as small as 100 nm or so.

Generally, when the temperature of a glass substrate becomes 600° C. or more, the deformation of glass substrate generates. Based on the relationship between the irradiation time of the plasma discharge and the maximum temperature of the surface of the substrate, the relationship between the irradiation time of the plasma discharge and the depth of the substrate which can be heated to 600° C. by the irradiation of the plasma discharge under the aforementioned conditions was assessed by simulation. More specifically, by three-dimensional thermal analysis, the depth of substrate which became 600° C. as an inner temperature of the substrate was determined. The results are shown in the graph of FIG. 2.

Figure 2:
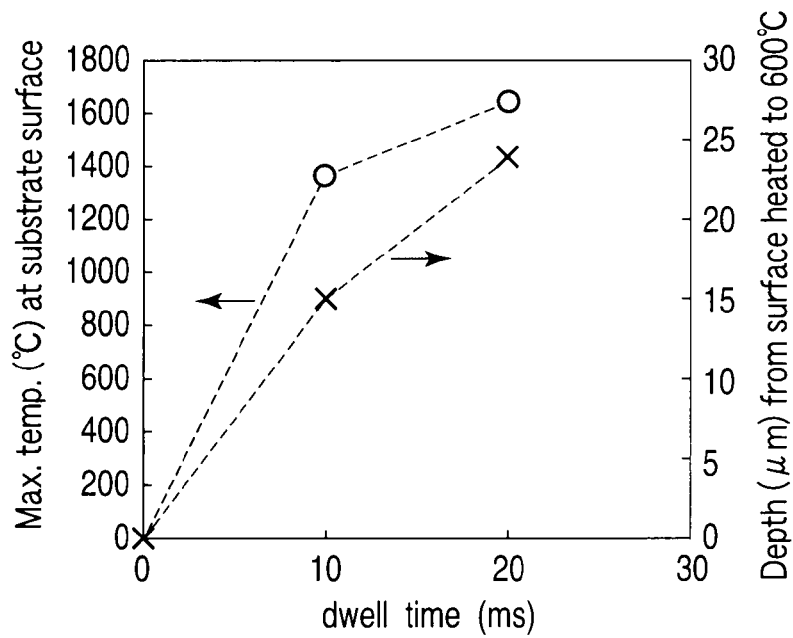
FIG. 2 is a graph showing the results of the simulation illustrating the relationship between the plasma-irradiating time and the temperature of substrate.

In FIG. 2, the plots of "○" represent the maximum temperature at the surface of substrate during each of the aforementioned irradiation times. The temperature of the interior of substrate was increased more slowly than the surface temperature of substrate as indicated by the plots of "×" representing the depth of substrate (from the surface of substrate) which became 600° C. due to the irradiation.

It will be recognized from these results that under the conditions of 10 ms during which the dehydrogenation treatment of hydrogenated amorphous silicon film was performed, the depth of substrate which was heated to 600° C. was limited to only 15 μm from the surface of substrate. Since the thickness of the glass substrate employed herein was 0.7 mm, even if a surface region of the substrate having a depth of only 15 μm was heated to 600° C., there would be no possibility of generating the deformation or degradation of substrate. Namely, if the irradiation is limited to a short time, even if the irradiation of heat source is performed so as to make the surface of substrate become as high as 1500° C. or so, it is possible to avoid the degradation of the glass substrate.

It has been confirmed by the present inventors that when the surface temperature of a substrate is increased to 1000° C. or more, the hydrogen existing in the hydrogenated amorphous silicon film can be dissociated. Although the effects of dehydrogenation can be enhanced by further increasing the surface temperature of the substrate, the glass substrate may deteriorate by the high-temperature heating. The temperature of the heated surface will be fixed so as to keep the glass temperature to be less than 600° C., by controlling the scanning velocity of the stage. In view of these facts, the surface temperature of the substrate that can be increased by the irradiation of plasma discharge is preferably confined to a temperature that is not higher than 2000° C. but not lower than 1500° C. The upper limit 2000° C. is determined from the viewpoint of the restricted scanning velocity of the stage.

If the irradiation time of plasma discharge is set to 1 millisecond (ms) or more so as to make the surface temperature of glass substrate 1000° C. or more, it is possible to obtain the effects of dehydrogenation. On the other hand, in view of the results of the simulation based on the thickness and heat resistance of the glass substrate, the irradiation time of the plasma discharge to the hydrogenated amorphous silicon film so as to make the surface temperature of glass substrate 1000° C. or more is confined to 500 ms or less.

As described above, the present invention is based on the finding of the optimal conditions for dissociating hydrogen from a hydrogenated amorphous silicon film by the irradiation of plasma discharge to the hydrogenated amorphous silicon film which is formed on the surface of a glass substrate. Specifically, the dehydrogenation treatment of the hydrogenated amorphous silicon film is performed by heating the surface of substrate at a temperature of 1000° C. or more for a period of as short as not more than 500 ms. Moreover, there is no possibility of bringing about the deformation or degradation of the glass substrate.

As long as the thickness of the glass substrate is confined to about 0.7 mm, the aforementioned conditions can be applied. The aforementioned conditions are not limited to the glass substrate but may be applied likewise to other kinds of non-heat-resistant substrates such as a plastic substrate.

It should be noted that, as other methods of irradiating a high temperature heat source for a short period of the order of milliseconds, there is known flash lamp annealing. Even when this flash lamp annealing is employed, the hydrogen can be dissociated from the hydrogenated amorphous silicon film. However, the temperature that can be attained using this flash lamp annealing is lower than that of plasma discharge and the control of temperature is difficult. Moreover, it is impossible in the case of this flash lamp annealing to selectively perform the dehydrogenation treatment at a predetermined region of the hydrogenated amorphous silicon film. If the reflectance of the surface of substrate is non-uniform as in the case where the substrate has a pattern where metals or semiconductors are mixedly existed therein, the dissociation of hydrogen may become non-uniform due to the existence of such a pattern.

In the present invention, it is possible to finely adjust the temperature of plasma discharge by controlling the electric power to be applied to a high-frequency power source and, at the same time, it is possible to control the surface temperature of substrate by suitably selecting the moving velocity of the stage carrying the substrate thereon. As described above, it is possible to selectively perform the dehydrogenation treatment at a predetermined region of the hydrogenated amorphous silicon film by suitably shifting the stage. Moreover, since the medium that is irradiated onto the hydrogenated amorphous silicon film is not the light but the heat, it is possible to perform the dehydrogenation treatment of any desired region in a spatially resolvable manner.

Since the plasma discharge which is relatively cheap as an apparatus and is capable of controlling the irradiation time is employed in the present invention, the present invention is apparently advantageous in carrying out the dehydrogenation treatment.

The amorphous silicon film from which hydrogen is dissociated can be crystallized by laser annealing, thereby making it possible to obtain polycrystalline silicon film. In this laser annealing, any desired kind of laser such as excimer laser, solid-state laser, etc., can be employed.

In the method of forming the crystalline silicon film according to one embodiment of the present invention, the amorphous silicon film prior to the crystallization thereof by laser annealing is already subjected to a dehydrogenation treatment through the irradiation of plasma discharge. Since the irradiation of plasma discharge is performed under specific conditions, there is no possibility of bringing about the deformation or degradation of the substrate during the dehydrogenation treatment. Moreover, since hydrogen is already dissociated, there is no possibility of generating ablation in the amorphous silicon film during the irradiation of laser beam, thus making it possible to obtain polycrystalline silicon film excellent in quality.

Especially, when a pulse laser beam which is expanded in pulse width by not less than three optical splitting/synthesizing means is irradiated onto the amorphous silicon film according to the following method, it is possible to sufficiently prolong the crystal growth time and hence to obtain a crystal of large crystal grain diameters.

More specifically, after being oscillated from a laser oscillator, a pulse laser beam is split into a plurality of laser beams by at least three splitting/synthesizing optical devices such as partially transparent mirrors or polarizing beam splitters and then the split laser beams are permitted to pass through optical paths differing in optical path length from each other, after which these split laser beams are re-synthesized each other. The re-synthesized laser beam is passed through an illumination optical system and modulated into a desired optical intensity distribution by a phase modulation element. Thereafter, the resultant laser beam is passed through a projecting optical system and irradiated onto the amorphous silicon film, thereby crystallizing the amorphous silicon film.

As the pulse laser beam to be oscillated from the laser oscillator, a pulse laser beam which is not less than 248 nm in wavelength and 15-30 ns in full width at half maximum can be employed.

The amorphous silicon film may be provided with a cap insulating film if required. This cap insulating film is a light-transmitting or light-absorbing film to be attached to one of the surfaces of amorphous silicon film which is opposite to the other surface of amorphous silicon film where the substrate is provided. The light-transmitting cap insulating film is formed of $SiO_2$ and the thickness thereof is preferably confined to 50 to 650 nm. In this case, sufficient effect for containing heat can be obtained without decreasing the heat conductive effect to the silicon film under the cap insulating film. Since this $SiO_2$ film can be formed in a more stable manner as compared with the light-absorbing cap insulating film such as the conventional $SiO_x$ film, it is possible to inhibit the non-uniformity in quality of crystallized silicon film.

With respect to the change with time of light intensity, it is important to sustain the light and hence to replenish the heat diffusing from the amorphous silicon film to the substrate or diffusing toward both of the substrate and the cap insulating film. This can be achieved by using at least three splitting/synthesizing optical devices. Using predetermined splitting/synthesizing optical devices, the pulse width of the pulse laser beam can be expanded and the dwell time of the pulse laser beam can be prolonged. During the irradiation of the pulse laser beam that has been prolonged, the silicon film can be kept at a temperature which is close to the upper limit and, at the same time, the temperature of both of the substrate and the cap insulating film is increased, thus enabling the heat diffusion to become moderate after finishing the irradiation of light. As a result, the cooling rate of the semiconductor film becomes slower and the melting time can be prolonged, thereby elongating the distance of crystal growth and making it possible to obtain a crystal of large grain diameters.

With respect to the light intensity distribution, it is preferable to employ one which enables the formation of a reverse peak-like distribution by the phase modulation element and which enables the light intensity to continuously change relative to the position. Such a light intensity distribution can be selected in the case of the one-dimensional crystal as well as in the case of the two-dimensional crystal.

Next, the fundamental principle of crystallization will be explained by referring, as one example, to a crystallizing apparatus which is equipped with a pair of polarizing beam splitters as light-splitting/synthesizing optical elements. Since not less than three light splitting/synthesizing elements are used, it is possible to obtain especially prominent pulse width-expanding effects as compared with the case where a pair of light splitting/synthesizing elements is used. The fundamental principle thereof is the same as the case where a pair of light splitting/synthesizing elements is used.

Figure 3:
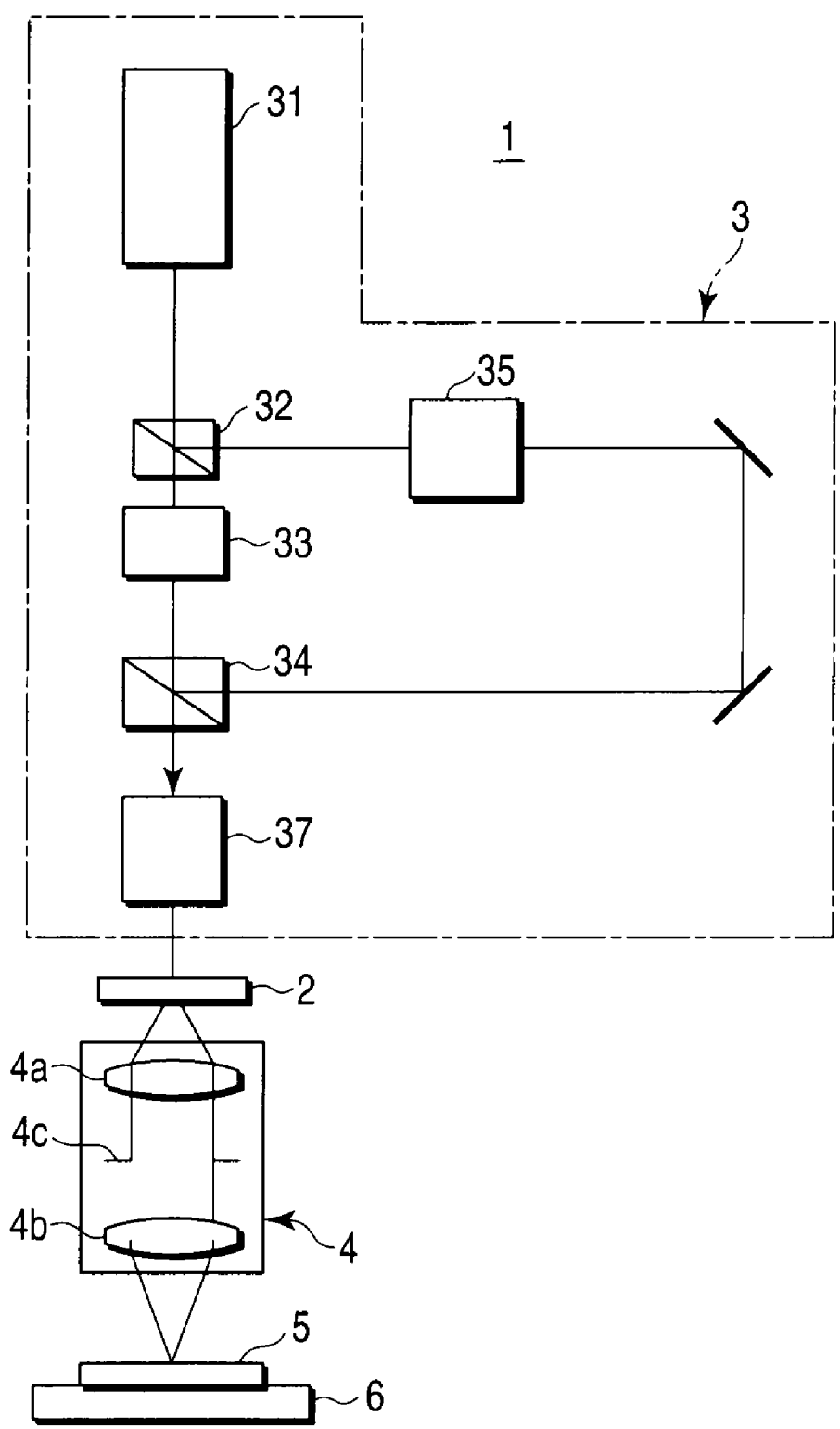
FIG. 3 is a structural block diagram illustrating the general view of the crystallization apparatus employing pulse laser irradiation for explaining the fundamental principle of the crystallization method according to one embodiment of the present invention.

The crystallization apparatus 1 shown in FIG. 3 is a projection-type irradiation apparatus and is equipped with a phase modulation element 2, an illumination system 3, an image-forming optical system 4 and a substrate stage 6. On this substrate stage 6 is mounted a target substrate 5 (i.e. a substrate to be treated). The pulse laser beam is designed to be irradiated onto the target substrate 5 after passing through the illumination system 3→the phase modulation element 2→the image-forming optical system 4. On the irradiating surface of the target substrate 5 is covered with an amorphous silicon film, i.e. a film to be crystallized and with a cap insulating film (for example, a silicon oxide film).

The phase modulation element 2 is interposed between the illumination system 3 and the image-forming optical system 4. This phase modulation element 2 is provided with a predetermined step portion at which Frensnel's diffraction generates in the laser beam group, thereby modulating the phase of incident light flux. As a result, the pulse laser beam is enabled to have a desired profile for optimally fuse and crystallize the film to be crystallized.

The illumination system 3 is equipped with an XeCl excimer laser oscillator as a light source 31 for outputting an energy beam for fusing the amorphous silicon film of the target substrate 5. This light source 5 is provided with inherent characteristics for oscillating a pulse laser beam having a wavelength of 308 nm and a pulse width (half bandwidth) of 30 ns. In the example shown in FIG. 3, there is explained one example where an XeCl excimer laser oscillator is employed as the light source 31. However, it is also possible to employ other kinds of light source such as a KrF excimer laser oscillator, an ArF excimer laser oscillator, a YAG laser oscillator, etc.

Further, the illumination system 3 is equipped, next to the light source 31, with a beam splitter 32 as a light-splitting means, a pair of attenuators 33 and 35 each as a laser intensity adjusting means, a beam splitter 34 as a light-synthesizing means, and an illuminating optical system 37 to be disposed to face the phase modulation element 2. The pulse laser beam emitted from the light source 31 is split by the beam splitter 32 into a P-polarized component P1 and an S-polarized component P2. The P-polarized component P1 linearly propagates along the optical axis of the light source 31 and enters, via the attenuator 33, into the beam splitter 34 acting as a light-synthesizing means. Whereas, the S-polarized component P2 propagates in the direction orthogonally intersecting the optical axis of light source and enters, via the attenuator 35, into the beam splitter 34 acting as a light-synthesizing means.

In this case, while the linearly propagating P-polarized component P1 is permitted to precede by passing it through a shorter laser beam path, the S-polarized component P2 propagating in the direction orthogonally intersecting the optical axis is permitted to pass through a longer laser beam path (for example, 10 m longer in optical path length), thereby slightly delaying it relative to the P-polarized component P1. The light intensity distribution of each of the P-polarized component P1 and the S-polarized component P2 is a sinusoidal light intensity distribution having a peak value. The delay time of the S-polarized component P2 relative to the P-polarized component P1 can be created by irradiating the S-polarized component P2 beam to a region of the attenuating light intensity distribution, which falls within the irradiation region of the P-polarized component P1.

Figure 4:
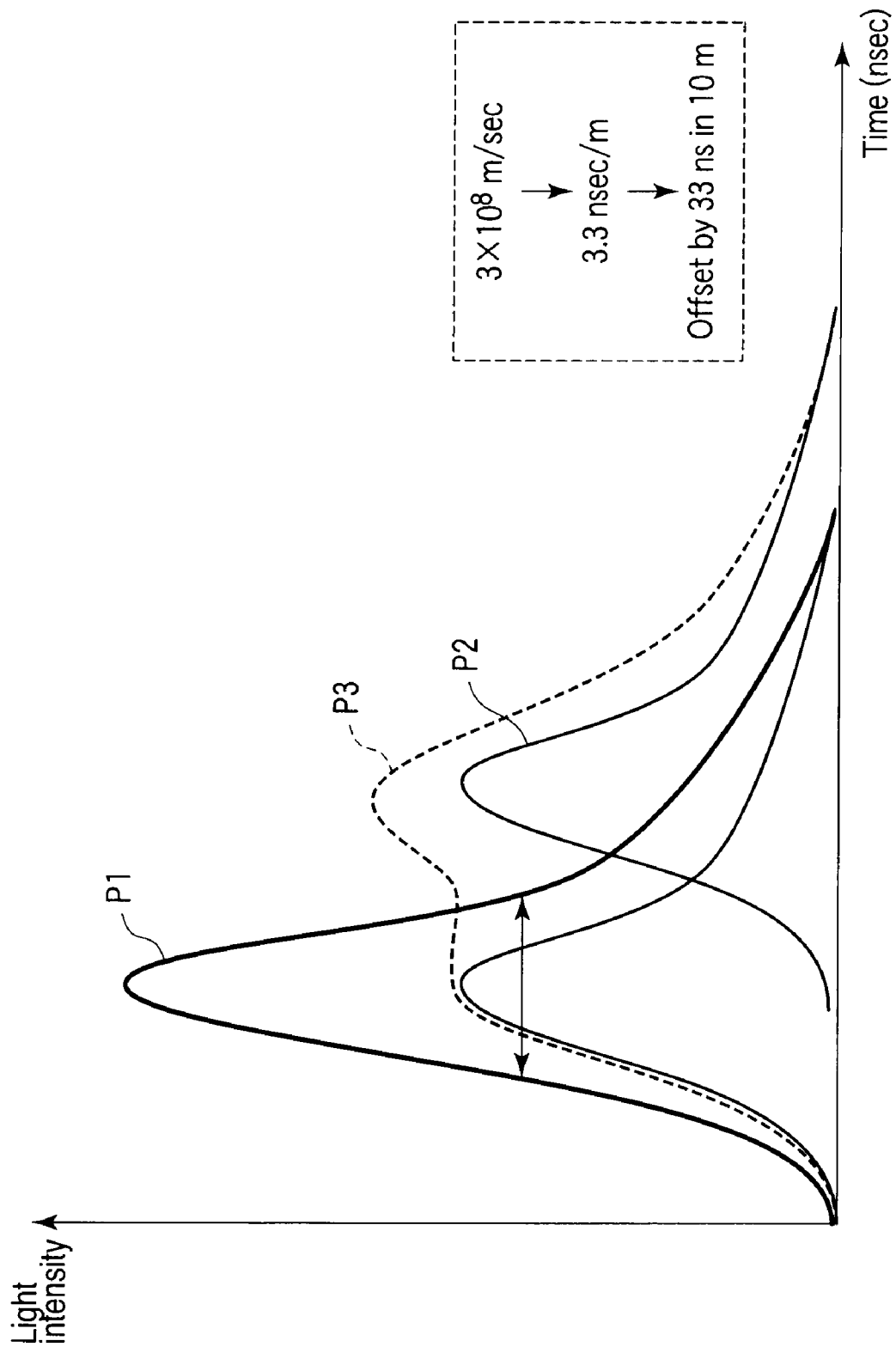
FIG. 4 is a diagram illustrating the light intensity distribution of the pulse laser beam that has been divided and synthesized.

These P-polarized component and S-polarized component are set to a desired pulse intensity ratio P1/P2 using a laser intensity adjusting means 33 such as an attenuator. Further, these P-polarized component and S-polarized component are synthesized using an optical synthesizing means such for example as the polarizing beam splitter 34, thereby turning them into a synthesized beam P3 having a wide pulse waveform as shown in FIG. 4. This synthesized beam P3 is enabled to pass, as a single pulse laser beam, through the phase modulation element and the image-forming optical system and ultimately permitted to enter into the amorphous silicon film formed on the target substrate.

This synthesized beam P3-receiving surface is fused and then crystallized in a solidifying process in the temperature-lowering period after the cut-off of the pulse laser beam. In this case, the pulse width (half bandwidth) of the synthesized beam P3 should preferably be set to a range which is 1.1 to 2.5 times as large as the pulse width (half bandwidth) of the reference beam. If the pulse width of the synthesized beam P3 is less than 1.1 times, the effects of irradiating a wider pulse beam would be vanished. If the pulse width of the synthesized beam P3 is more than 2.5 times, the coherence of the synthesized beam P3 as a single pulse beam would be deteriorated, thereby making it impossible to uniformly fuse and crystallize the amorphous silicon film.

In other words, the synthesized beam P3-receiving surface is treated in such a manner that under the conditions where the target substrate 5 which is mounted on the substrate stage 6 is moved in the X-axis direction for example at a predetermined velocity, the target substrate 5 is irradiated at first with the P-polarized component P1 and, after the aforementioned delay time, the target substrate 5 is irradiated with the S-polarized component P2.

As a result, the synthesized beam P3-receiving surface becomes wider than the laser beam-receiving surface P that has been emitted from the light source as shown in FIG. 4. Therefore, the crystallization region can be increased correspondingly. The light intensity distribution of FIG. 4 illustrates the light intensity distribution of the out-going light from the light-synthesizing means 34. As a result, it is now possible to create a large crystallization region by a single shot of laser beam from the laser beam source 31.

In the example shown in FIG. 3, although a pair of beam splitters 32 and 34 are employed respectively as the optical splitting/synthesizing means of pulse laser beam for the convenience of explanation, the number of the optical splitting/synthesizing means of pulse laser beam is required to be not less than three, preferably 3 to 12. Using not less than three optical splitting/synthesizing means as described above, it is now possible to obtain a pulse laser beam having a wider pulse width. It should be noted that when the number of optical splitting/synthesizing means to be disposed is increased larger than 12, the resultant apparatus would become complicated and excessively large in scale, thereby increasing the manufacturing cost and hence making it undesirable.

By taking into consideration the cost of apparatus, the stability of performance, etc., as a whole, the optical splitting/synthesizing means may be selected from the polarizing beam splitter, a half mirror and combinations of these splitter and mirror. With respect to the splitting angle of light in the case where the polarizing beam splitter is employed, it may be optionally selected from the range of 5° to 175°. However, in view of simplifying the structure of the apparatus and the easiness of designing the layout in balance to the peripheral equipments, the splitting angle of light should preferably be set to 90°±1°.

Figure 5:
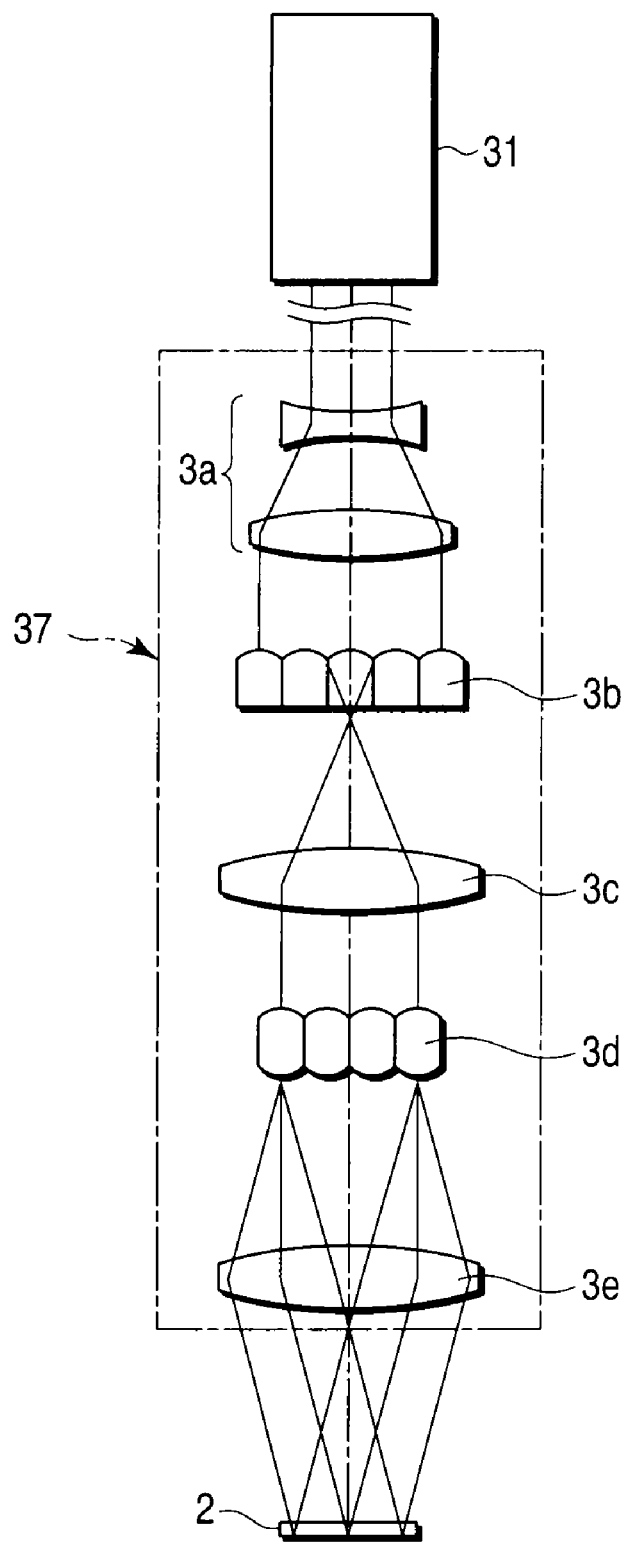
FIG. 5 is a structural block diagram illustrating the optical system of the apparatus shown in FIG. 3.

Next, the details of the illuminating optical system 37 will be explained with reference to FIG. 5.

The synthesized beam P3 transmitted to the illuminating optical system 37 is expanded by a beam expander 3a and then transmitted to a first fly-eye lens 3b. As a result, a plurality of small light sources is created on the rear side focal plane of the first fly-eye lens 3b. The light flux from these plurality of small light sources is irradiated, in a superimposed manner and via a first condenser optical system 3c, to the incident plane of a second fly-eye lens 3d. As a result, a larger number of small light sources than that of the rear side focal plane of the first fly-eye lens 3b are created on the rear side focal plane of the second fly-eye lens 3d.

The light flux from these plurality of small light sources that have been created on the rear side focal plane of the second fly-eye lens 3d are irradiated, in a superimposed manner and via a second condenser optical system 3e, to the phase modulation element 2. Herein, the first fly-eye lens 3b and the first condenser optical system 3c constitute a first homogenizer, through which the homogenization of incident angle of the laser beam that has been supplied from the light source 31 can be achieved at the phase modulation element 2.

The second fly-eye lens 3d and the second condenser optical system 3e constitute a second homogenizer, through which the homogenization of the light intensity of the laser beam that has been transmitted from the first homogenizer and homogenized in incident angle can be achieved at each in-plane of the phase modulation element 2. In this manner, the illuminating system 3 irradiates the phase modulation element 2 with a laser beam having substantially a uniform light intensity distribution.

The laser beam that has been phase-modulated by the phase modulation element 2 is a beam having a reverse peak pattern-like light intensity distribution. The reverse peak pattern-like light intensity distribution means a distribution wherein a minimum value of light intensity and a maximum value of light intensity are successively altered within the beam diameter of one shot of laser beam. The minimum value of light intensity is set to a temperature which is lower than the melting point of the amorphous silicon film on the target substrate and transmitted, via the image-forming optical system 4, to the target substrate 5.

Herein, in the image-forming optical system 4, the surface of pattern of the phase modulation element 2 and the target substrate 5 (in a strict sense, the upper surface of the amorphous silicon film) are disposed in an optically conjugated manner. In other words, the target substrate 5 is set on an optically conjugated plane (the imaging plane of the image-forming optical system 4) relative to the surface of pattern of the phase modulation element 2.

The image-forming optical system 4 is equipped with an aperture diaphragm 4c between a front positive lens group 4a and a rear positive lens group 4b. The aperture diaphragm 4c is constituted by a plurality of aperture diaphragms differing in size of opening portion (light-transmitting portion) from each other for example. A plurality of these aperture diaphragms 4c may be constituted in an exchangeable manner relative to the optical path. Alternatively, the aperture diaphragm 4c may be constituted by an iris diaphragm wherein the size of aperture can be continuously varied.

In any case, the magnitude of the aperture of aperture diaphragm 4c (therefore, the number of image side aperture (NA) of the image-forming optical system 4) is set so as to generate a desired light intensity distribution on the amorphous silicon film of the target substrate 5 as described hereinafter. This image-forming optical system 4 may be a refractive optical system or a reflective optical system or a refractive/reflective optical system.

Ultimately, the synthesized beam P3 is imaged on the amorphous silicon film on the target substrate 5. As a result, the amorphous silicon film is fused and then crystallized in a subsequent solidifying process. The target substrate 5 is constructed in such a manner that an amorphous silicon film is deposited, via an underlying insulating film, on a glass substrate for a liquid crystal display for example by a chemical vapor phase deposition method (CVD).

Preferably, an insulating film such as an $SiO_2$ film is deposited as a cap insulating film on the amorphous silicon film. The cap insulating film is heated by a portion of the optical beam to be irradiated onto the amorphous silicon film, thereby accumulating the heated temperature. If there is no cap insulating film on the amorphous silicon film, a high-temperature portion of the irradiated surface of the amorphous silicon film may be relatively rapidly cooled as the irradiation of the laser beam is cut off. However, due to this heat-accumulating effect, this temperature-cooling gradient can be mitigated to promote the crystal growth in the lateral direction of large crystal grain. The target substrate 5 is positioned and retained in place at a predetermined region on the substrate stage 6 using a vacuum chuck or an electrostatic chuck.

Next, the crystallization method and a schematic view of the crystallizing apparatus according to one embodiment of the present invention will be explained with reference to FIG. 6.

The crystallizing apparatus shown in FIG. 6 is equipped with a laser beam source, seven partially transparent mirrors R1-R7, a totally reflecting mirror, an illuminating optical system, a phase modulation element, a projecting optical system, and a substrate stage. On the substrate stage is mounted a target substrate carrying an amorphous silicon film thereon.

The pulse laser beam emitted from the laser beam source is irradiated onto the target substrate after passing through the partially transparent mirrors, the totally reflecting mirror, the illuminating optical system, the phase modulation element, and the projecting optical system.

As the pulse laser beam to be oscillated from the laser oscillator, an XeCl excimer laser having a wavelength of 308 nm and a full width at half maximum of about 25 ns was employed. The laser beam that has been oscillated from the laser oscillator is introduced into an optical apparatus which is constituted by seven partially transparent mirrors R1-R7, a totally reflecting mirror, and totally reflecting concave mirrors for suitably setting the distance between these optical elements as well as the optical path of these optical elements. The reflectance Rn of each of the partially transparent mirrors was set, when mentioned in the order of the optical path position located closer to the laser, to R1=0.40, R2=0.07, R3=0.085, R4=0.095, R5=0.125, R6=0.17 and R7=0.25. The totally reflecting mirror was disposed behind the partially transparent mirror exhibiting the reflectance R7. The length of optical path between neighboring mirrors was set to 4500 mm.

It should be noted that in this embodiment, a partially transparent mirror is interposed between totally reflecting concave mirrors. However, a plane mirror may be substituted for the totally reflecting concave mirror. Alternatively, the partially transparent mirrors may be linearly arranged without using these plane mirrors as shown in FIG. 6.

In the aforementioned crystallizing apparatus shown in FIG. 6, the transmission and reflection of the pulse laser beam using seven partially transparent mirrors can be performed as described below. Namely, the light that has passed through the first partially transparent mirror R1 is transmitted to the second partially transparent mirror R2, and the light that has been reflected by the first partially transparent mirror R1 is transmitted to the illuminating optical system. The light that has passed through the second partially transparent mirror R2 is transmitted to the third partially transparent mirror R3, and the light that has been reflected by the second partially transparent mirror R2 is transmitted, via the first partially transparent mirror R1, to the illuminating optical system. Thus, the light that has passed through the n-th partially transparent mirror is transmitted to the n+1th partially transparent mirror, and the light that has been reflected by the n-th partially transparent mirror is transmitted, via the n−1th, the n−2th, . . . , and the first partially transparent mirror R1, to the illuminating optical system.

It should be noted that the light that has passed through the seventh partially transparent mirror R7 is reflected by the totally reflecting mirror and transmitted, via the seventh, the sixth, . . . , and the first partially transparent mirror R1, to the illuminating optical system.

By repeating the transmission and reflection of light as described above, the pulse width can be expanded and the dwell time to the target substrate can be prolonged. As a result, at the moment when the temperature of the silicon film is increased to the maximum, a larger quantity of heat as compared with that where the pulse width is not expanded is enabled to diffuse into the cap insulating film and the underlying insulating film from the silicon film, thereby raising the temperature of these films. Because of this, the cooling rate of the silicon film decreases and the melting time period of the silicon film will be prolonged, thus increasing the length of crystal growth. As a result, it is possible to obtain a crystal of large grain diameters. When these conditions are optimized, it becomes possible to realize the formation of polycrystalline silicon of large grain size having a diameter of as large as 30 μm. In this case, it is possible to form a pare transistor in one grain.

As described above, since the dehydrogenation treatment method according to one embodiment of the present invention is performed by the irradiation of plasma discharge to a hydrogenated amorphous silicon film, it is possible to achieve a large spatial resolution without pattern dependency. Therefore, it is now possible to perform a selective dehydrogenation treatment of only a desired region of the hydrogenated amorphous silicon film. By performing the crystallization of the amorphous silicon film obtained from the dehydrogenation treatment by laser annealing, it is possible to form an element display region together with the peripheral circuits on a single piece of glass substrate. This method will be explained with reference to FIGS. 7 through 10.

Figure 7:
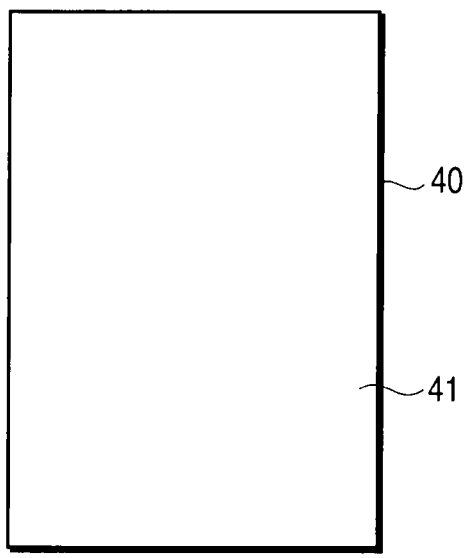
FIG. 7 is a plan view illustrating the crystallization method according to another embodiment of the present invention.
Figure 8:
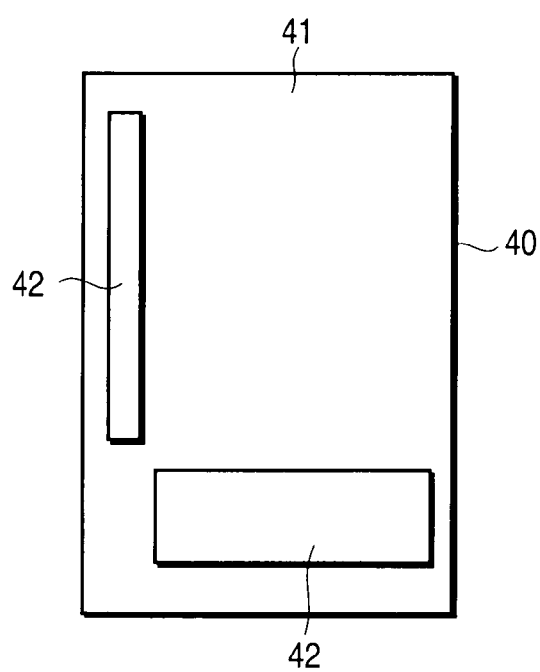
FIG. 8 is a plan view illustrating a step following the step shown in FIG. 7.
Figure 10:
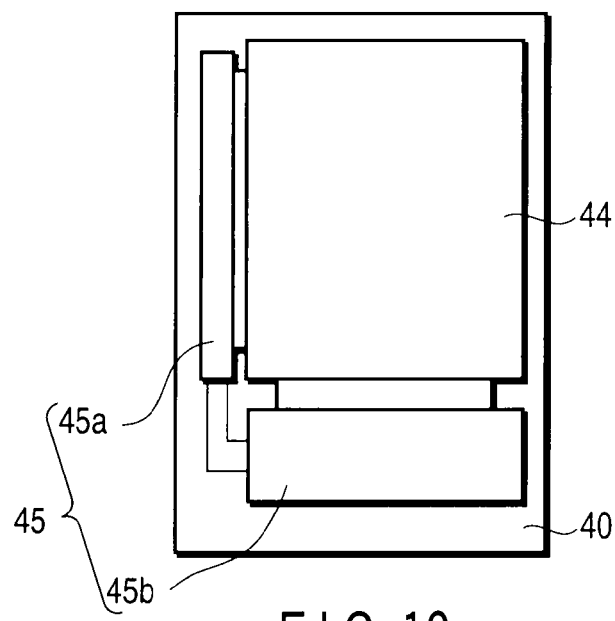
FIG. 10 is a plan view illustrating a step following the step shown in FIG. 9.

First of all, as shown in FIG. 7, a hydrogenated amorphous silicon film 41 is formed all over the surface of a glass substrate 40 and then a plasma discharge is selectively irradiated onto a predetermined region of the silicon film 41 by the aforementioned procedures. In this hydrogenated amorphous silicon film 41, hydrogen will be selectively dissociated from the regions where the plasma discharge is irradiated, thereby converting the regions into amorphous silicon regions 42 as shown in FIG. 8.

Figure 9:
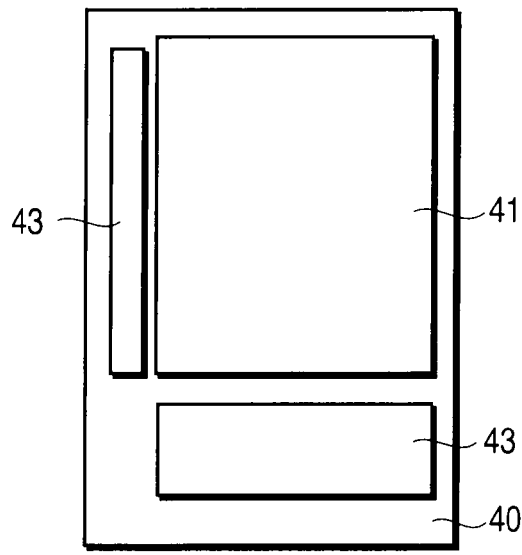
FIG. 9 is a plan view illustrating a step following the step shown in FIG. 8.

Then, a laser beam is irradiated onto the amorphous silicon regions 42 to crystallize these regions 42 to obtain polycrystalline silicon regions. Redundant portions of the hydrogenated amorphous silicon film 41 are then removed by etching, thus leaving the hydrogenated amorphous silicon film 41 and the polycrystalline silicon regions 43 on the surface of the glass substrate 40 as shown in FIG. 9.

By conventional method, TFTs are formed on each of these silicon regions. As a result, the hydrogenated amorphous silicon film 41 is turned into a display element region 44 and the polycrystalline silicon regions 43 are turned into peripheral circuit regions 45. More specifically, it is possible to obtain peripheral circuit regions such as a gate driver circuit 45a and an analog SW 45b. A DAC, memories, a high-speed interface, etc., can be formed in the polycrystalline silicon regions 43.

By forming a display element and driving circuits on the same glass substrate as described above, it is possible to realize a high-value added display which is provided with excellent reliability, highly refined elements and a merit of low power consumption.

As described above, according to the present invention, it is now possible to perform the dehydrogenation treatment of a hydrogenated amorphous silicon film formed on a substrate which is poor in heat resistance, thereby making it possible to remarkably increase the degree of freedom of the laser-crystallizing process.

According to the present invention, it is now possible to provide a dehydrogenation treatment method for forming an amorphous silicon film which is excellent in laser resistance without giving any adverse influence to a non-heat-resistant substrate and also possible to provide a method for crystallizing the amorphous silicon film obtained as described above.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A dehydrogenation treatment method comprising:
   forming a hydrogenated amorphous silicon film above a non-heat-resistant substrate; and
   eliminating bonded hydrogen from the hydrogenated amorphous silicon film by irradiating an atmospheric thermal plasma discharge to the hydrogenated amorphous silicon film for a time period of 1 to 500 ms to heat a surface of the substrate at a temperature of not lower than 1500° C. and not higher than 2000° C. through the irradiation of the atmospheric thermal plasma discharge.

2. The method according to claim 1, wherein the hydrogenated amorphous silicon film is formed by CVD method.

3. The method according to claim 2, wherein the hydrogenated amorphous silicon film is formed using silane gas as a raw material.

4. The method according to claim 1, wherein the hydrogenated amorphous silicon film contains 10 to 15% of bonded hydrogen.

5. The method according to claim 1, wherein the substrate is a glass substrate.

6. The method according to claim 1, wherein the atmospheric thermal plasma discharge is irradiated onto the hydrogenated amorphous silicon film for a time period of not more than 100 ms.

7. The method according to claim 1, wherein the atmospheric thermal plasma discharge is generated using a high-frequency plasma as a thermal plasma source.

8. The method according to claim 1, wherein the concentration of the bonded hydrogen in the hydrogenated amorphous silicon film after irradiating the atmospheric thermal plasma discharge is less than 1%.

9. A method for forming a crystalline silicon film comprising:
   forming an amorphous silicon film above a non-heat-resistant substrate; and
   irradiating laser beam to the amorphous silicon film to crystallize the amorphous silicon film;
   wherein forming the amorphous silicon film is performed by applying a dehydrogenation treatment to the hydrogenated amorphous silicon film using the method claimed in claim 1.

10. The method according to claim 9, wherein the dehydrogenation treatment is applied selectively to part of the hydrogenated amorphous silicon film and the crystalline silicon film is selectively formed above the non-heat-resistant substrate.

11. The method according to claim 9, further comprising forming an underlying film on the non-heat-resistant substrate before forming the amorphous silicon film.

12. The method according to claim 11, wherein the underlying insulating film is an $SiO_2$ film.

13. The method according to claim 9, further comprising forming a cap insulating film on the amorphous silicon film.

14. The method according to claim 13, wherein the cap insulating film is an $SiO_2$ film.

15. The method according to claim 14, wherein the cap insulating film has a thickness ranging from 50 to 650 nm.

16. The method according to claim 9, wherein the laser beam is a pulse laser beam which is expanded in pulse width.

17. The method according to claim 9, wherein the crystalline silicon film contains polycrystalline silicon having a grain diameter of 30 µm.

* * * * *